United States Patent [19]

Bailey

[11] Patent Number: 4,750,193

[45] Date of Patent: Jun. 7, 1988

[54] PHASE-LOCKED DATA DETECTOR

[75] Inventor: James A. Bailey, Tucson, Ariz.

[73] Assignee: International Business Machines Corporation, Armonk, N.Y.

[21] Appl. No.: 40,387

[22] Filed: Apr. 20, 1987

[51] Int. Cl.$^4$ .............................................. H03D 3/24
[52] U.S. Cl. ..................................... 375/81; 375/120; 331/1 A; 328/55
[58] Field of Search ................... 375/81, 87, 95, 110, 375/120, 97; 331/1 A; 360/40; 328/55

[56] References Cited

U.S. PATENT DOCUMENTS

| | | | |
|---|---|---|---|
| 3,983,498 | 9/1976 | Malek | 328/55 |
| 3,983,506 | 9/1976 | Rettinger, Jr. et al. | 331/1 A |
| 4,017,806 | 4/1977 | Rogers | 331/1 A |
| 4,105,946 | 8/1978 | Ikeda | 331/1 A |
| 4,112,383 | 9/1978 | Burgert | 329/50 |
| 4,121,172 | 10/1978 | Garde | 331/1 A |
| 4,134,081 | 1/1979 | Pittaro | 331/1 A |
| 4,229,823 | 10/1980 | Thomson et al. | 375/113 |
| 4,246,545 | 1/1981 | Reisfeld | 331/1 A |
| 4,437,072 | 3/1984 | Asami | 331/1 A |
| 4,534,044 | 8/1985 | Funke et al. | 375/120 |

Primary Examiner—Robert L. Griffin
Assistant Examiner—Marianne Huseman
Attorney, Agent, or Firm—J. M. Thomson

[57] ABSTRACT

The data detector for extracting clock information from an encoded run length limited data signal, including a control loop comprised of a phase detector, the charge pump, a filter buffer circuit and a voltage-controlled oscillator, wherein the data detector embodies a monostable multivibrator having a Q2 output that changes from low to high state at one-half the duration of the Q1 output, so that the Q2 output lags Q1 by 90 degrees and appears in phase with the extracted clock signal when the loop is locked.

5 Claims, 3 Drawing Sheets

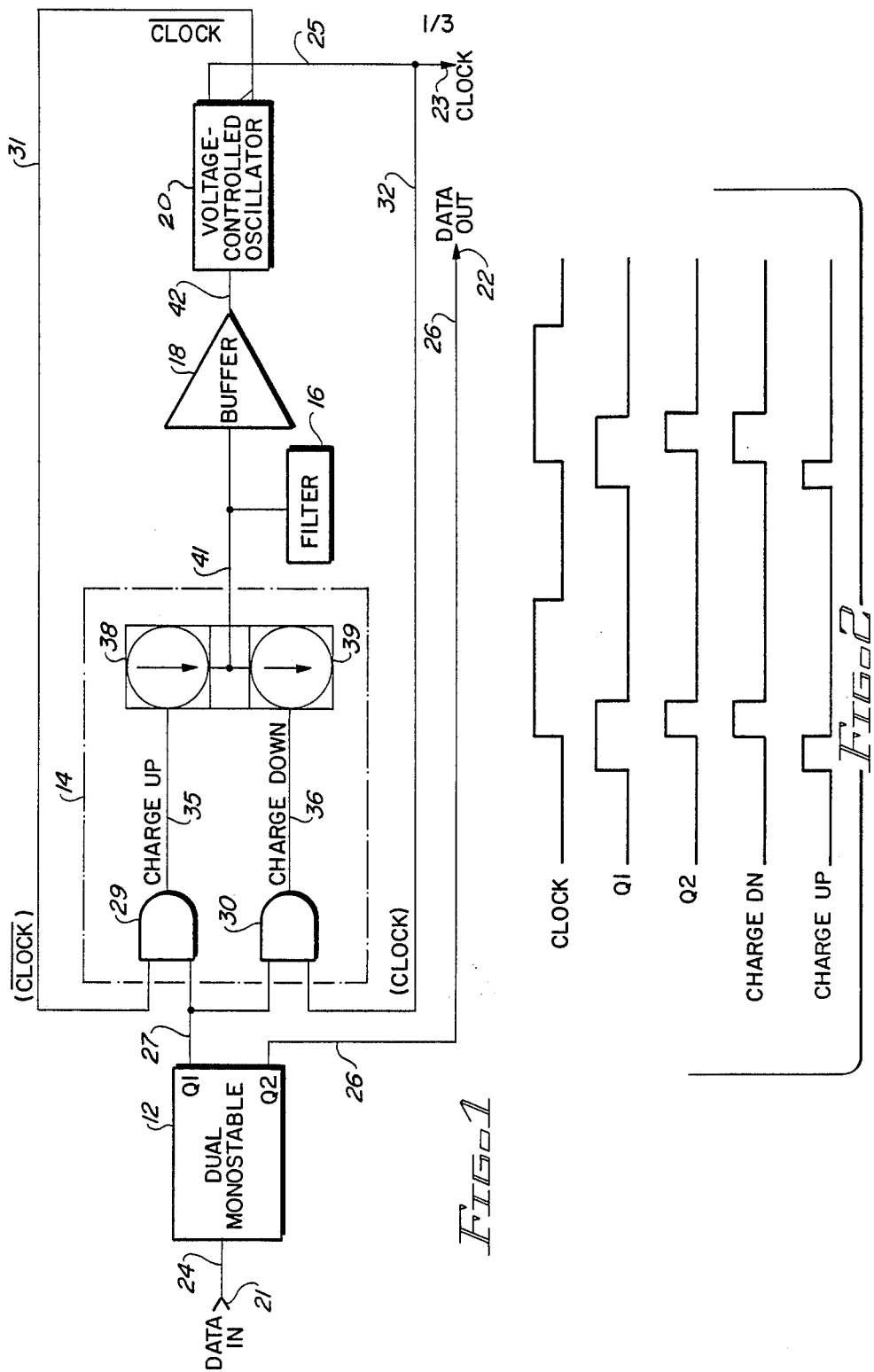

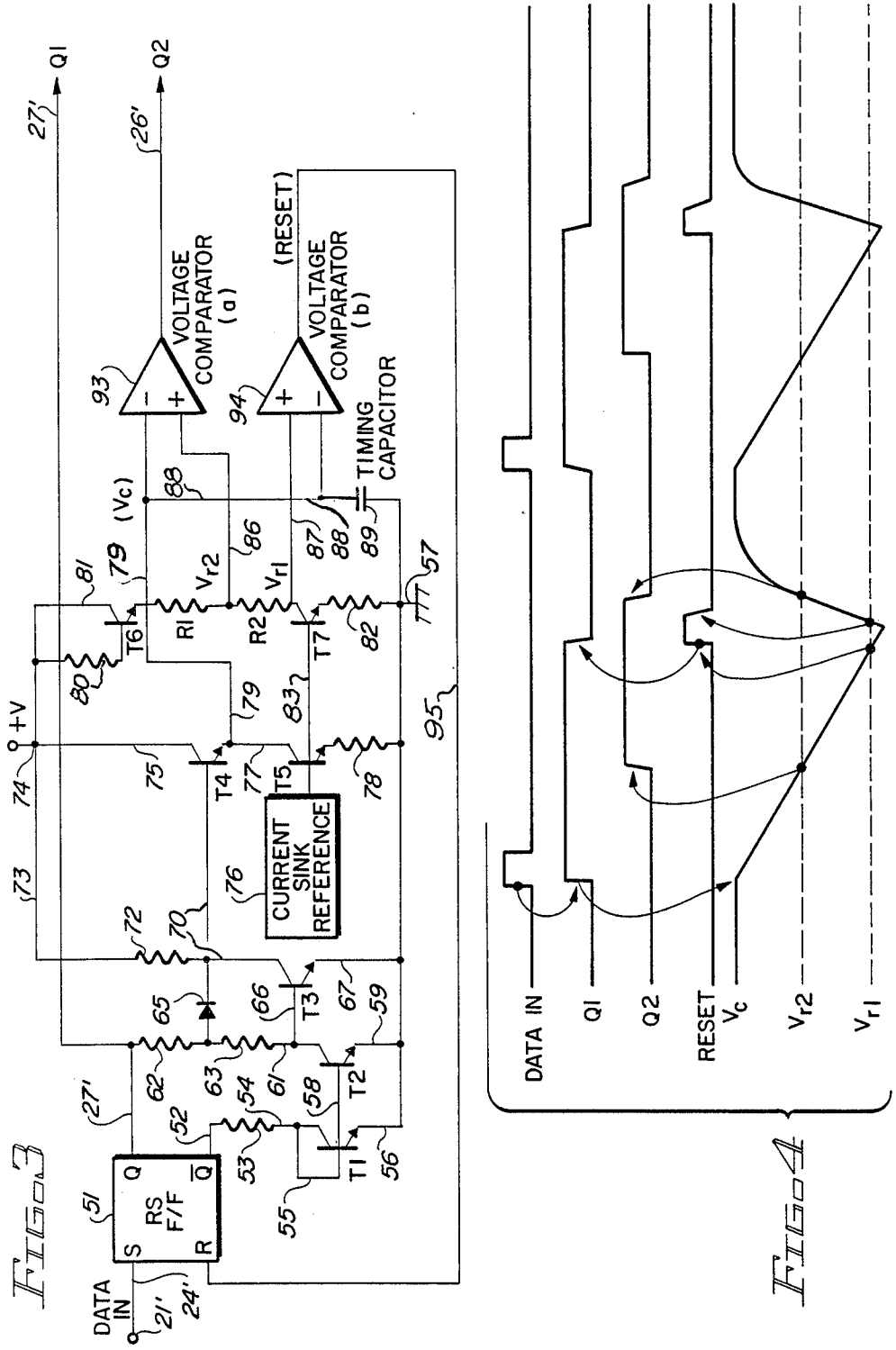

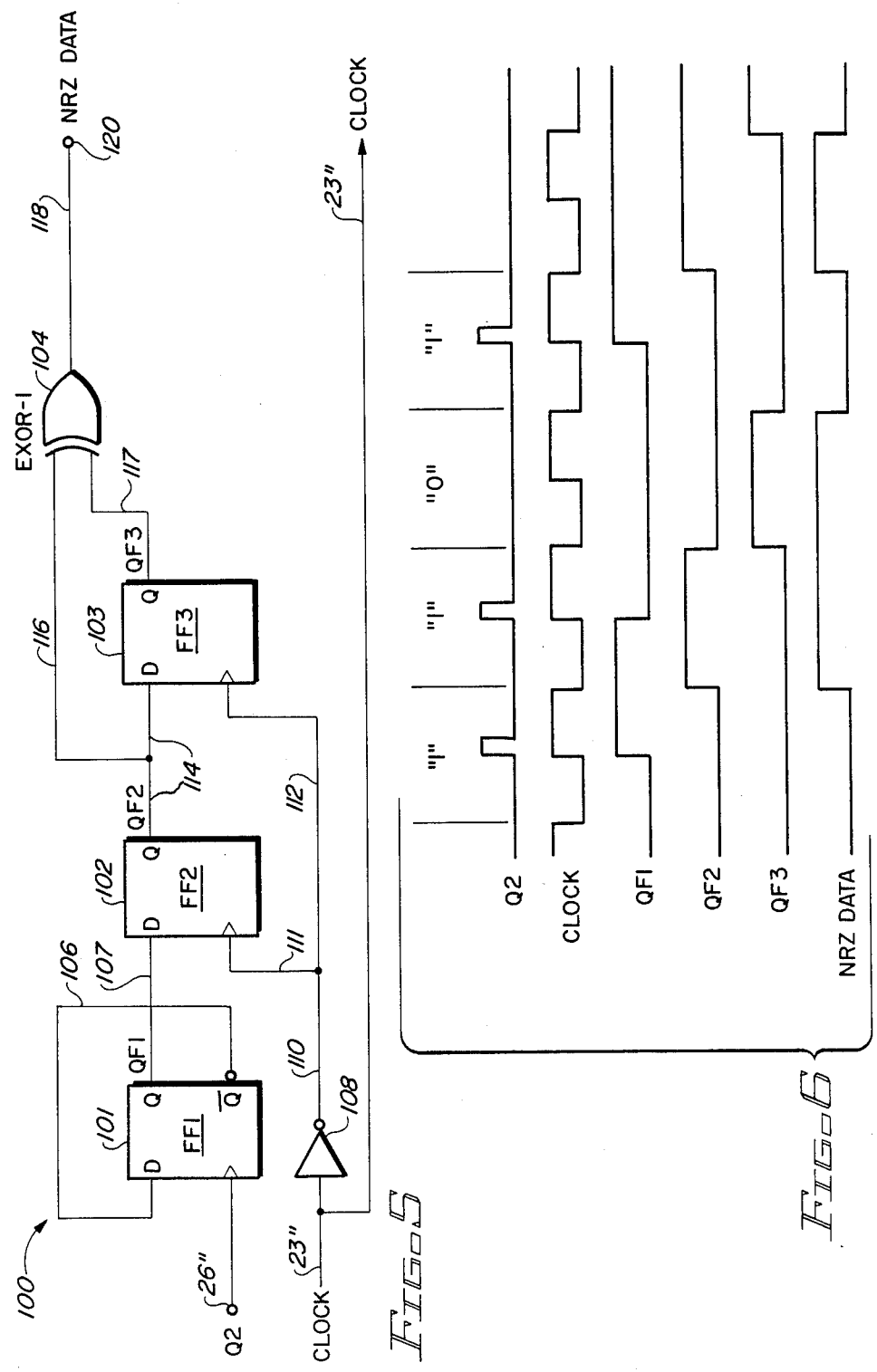

PHASE-LOCKED DATA DETECTOR

BACKGROUND OF THE INVENTION

This invention relates to phase-locked loop circuitry. More particularly the invention relates to a data detection circuit including a phase-locked loop circuit that uses a dual-output multivibrator to phase align clock and data pulses.

Previous phase-locked data detector circuits use a monostable multivibrator circuit having a pulse width equal to the pulse width of the voltage-controlled oscillator. With pulse widths equal, detection of a "1" in the data input occurs on the rising edge of the voltage-controlled oscillator pulse, while phase detection takes place on the falling edge. In order to maintain small steady-state phase error, prior art circuits require that the pulse width of the monostable multivibrator be tuned dynamically to match the pulse width of the voltage-controlled oscillator as the oscillator changes frequency with a varying control voltage input. Practical implementations of the prior art require that both the nominal frequency of the voltage-controlled oscillator and the pulse width of the monostable multivibrator be carefully controlled or adjusted at time of manufacture in order to maintain a small steady-state phase error.

For many of the prior art circuits, the correction logic used creates a "dead band" at near zero phase error. This occurs unless the difference in phase between the single-shot multivibrator pulse and the clock pulse exceeds the set-up time of the correction logic. During such dead-band time, no correction signal is generated. Consequently, the circuits exhibit an inherent jitter as utilized in phase-locked data detectors.

DISCUSSION OF THE PRIOR ART

A search of the prior art disclosed the following references:

U.S. Pat. No. 4,017,806 to Rogers;
U.S. Pat. No. 4,105,946 to Ikeda;
U.S. Pat. No. 4,112,383 to Burgert;
U.S. Pat. No. 4,121,172 to Garde;
U.S. Pat. No. 4,134,081 to Pittaro;
U.S. Pat. No. 4,229,823 to Thomson, et al;
U.S. Pat. No. 4,437,072 to Asami; and
U.S. Pat. No. 4,246,545 to Reisfeld.

U.S. Pat. No. 4,246,545 to Reisfeld is pertinent to the present application in the sense that it discloses a data signal responsive phase-locked loop that represents the prior art described above. Reisfeld, otherwise, does not relate to the novel portions of the application described hereinafter.

The remaining patents include phase-locked circuits, but either perform a different function or use entirely different techniques to accomplish the function. Consequently, they do not appear to be pertinent to this application.

SUMMARY OF THE INVENTION

Briefly, the invention concerns a data detector for extracting clock information from an encoded run length limited data signal. The data detector includes a control loop or phase-locked loop comprised of a phase detector, a charge pump, a filter and buffer circuit therefore, and a voltage-controlled oscillator which is adjusted in response to control signals from the phase detector. The data detector embodies a dual-output monostable multivibrator having a Q2 output that changes from its low to high state at one-half the duration of the Q1 output. Consequently, the Q2 output lags the Q1 output by 90 degrees, and appears in phase with the extracted clock signal when the loop is in a locked mode.

This invention eliminates the need for a variable pulse-width, tracking monostable multivibrator as well as any precise control or adjustment of the monostable multivibrator pulse width or the voltage-controlled oscillator nominal frequency. This is accomplished by providing the monostable multivibrator that generates two output pulses, with the leading edge of the second output pulse occurring exactly halfway through the first output pulse. The circuit is advantageous because this pulse relationship is easily achieved by circuits fabricated using integrated circuit design techniques or other techniques, and does not require subsequent adjustment at time of manufacture. In addition, the invention is advantageous because the resulting correction logic does not produce the "dead band" with its accompanying jitter in the voltage controlled oscillator output as present in many prior art circuits.

The foregoing and other objects, features and advantages of the invention will be apparent from the following detailed description of the preferred embodiments of the invention, as illustrated in the accompanying drawings.

BRIEF DESCRIPTION OF THE DRAWINGS

FIG. 1 is a schematic of the system of the invention.

FIG. 2 is a waveform diagram useful in explaining the operation of FIG. 1.

FIG. 3 is a circuit diagram of a dual-output monostable multivibrator as utilized in the phase detector of FIG. 1.

FIG. 4 is a waveform diagram useful in explaining the operation of the circuit of FIG. 3.

FIG. 5 is a schematic illustration of a return-to-zero data to non-return-to-zero data converter.

FIG. 6 is a waveform useful in explaining the operation of the data converter of FIG. 5.

DESCRIPTION OF THE PREFERRED EMBODIMENT

Referring now to the drawings, and particularly to FIG. 1, a schematic of a phase-locked loop data detector designed in accordance with the invention is described. The system includes a dual-output monostable multivibrator 12, a charge pump generally indicated by the numeral 14, a filter 16, a buffer circuit 18 and a voltage-controlled oscillator 20. These elements are arranged in a type-II control loop including a data input terminal 21, a clock terminal 23 and a data output terminal 22.

The data input terminal is connected to the set latch input of multivibrator 12 by a conductor 24. The reset of the multivibrator is an internal circuit not illustrated in FIG. 1, but which is explained in connection with FIG. 3 hereinafter. The Q1 output of the multivibrator is connected via conductor 27 as an input to each of gates 29, 30 as illustrated. The Q2 output of the multivibrator is connected by conductor 26 to the data output terminal. Logic gate 29, which comprises an AND gate, receives another input comprising the clock not output of the voltage-controlled oscillator via conductor 31. AND gate 30 receives a second input via conductor 32 comprising the clock output of the voltage-controlled oscillator.

The output of gate 29 is connected by conductor 35 as a charge-up signal to the charge-up element of a standard charge pump 38. In similar fashion, the output of gate 30 is connected as a charge-down signal by conductor 36 to the charge-down element of charge pump element 39.

Thus, when a positive signal is present on conductor 35, the capacitive element within filter 16 receives a charging current via element 38 and conductor 41 in conventional fashion. Likewise, when a positive signal is present upon conductor 36 from gate 30, the filter capacitive element is discharged via conductor 41 and charge-down element 39 of the charge pump. The voltage level on filter 16 is conducted via a buffer circuit 18 and conductor 42 to comprise a control signal input to voltage-controlled oscillator 20. The voltage-controlled oscillator comprises a standard voltage-controlled oscillator having a clock frequency that varies in accordance with the control signal.

The phase detector provides control signals to the charge pump circuit to cause charge to be delivered or removed from the filter, with the control signals being generated based upon the state of the clock at the time the monostable multivibrator output Q1 occurs.

Referring to FIG. 2, if the clock output is low, a charge-up signal is produced. On the other hand, if the clock is high, a charge-down signal is generated. Phase lock occurs when the charge-up and charge-down signals have equal duration. This means that the clock spends an equal amount of time in the high state and the low state during a Q1 monostable multivibrator pulse. Consequently, lock occurs with the clock exactly 90 degrees out of phase with the Q1 monostable multivibrator output. This lock condition is unique and particularly applicable to make the circuit useable for data detection in the system described. The unique feature results from the use of a monostable multivibrator which produces two outputs, Q1 and Q2, with the Q2 output changing from the low to the high state at exactly half the duration of a Q1 output. The Q2 output lags Q1 by exactly 90 degrees and, therefore, appears in phase with the clock signal when the loop is locked.

Referring to FIG. 3, a specific circuit for a dual-output monostable multivibrator such as that illustrated as element 12 in FIG. 1 is described. Like primed numerals are used in FIG. 3 to represent equivalent elements illustrated in FIG. 1. Thus, a data in terminal 21' is connected by conductor 24' to the set input of a setreset latch 51. The reset input of the latch is connected by conductor 95 to the output of a voltage comparator 94. The Q output of the latch is connected by conductor 27' to the input of logic gate 29, not illustrated. The output of a voltage comparator 93 is connected by conductor 26' to the data output terminal, not illustrated.

The $\overline{Q}$ output of latch 51 is connected by a conductor 52, resistor 53 and conductor 54 to the collector of transistor T1. The collector of transistor T1 is connected by conductor 55 to the base of T1. The emitter of T1 is connected by conductor 56 to a reference terminal 57. The base of T1 is also connected by conductor 58 to the base of transistor T2. The collector of transistor T2 is connected by conductor 61 and resistors 62, 63 to conductor 27'. The emitter of transistor T2 is connected by conductor 59 to reference 57.

A diode 65 connects the common juncture of resistor 62, 63 to the collector of transistor T3. A conductor 66 connects the collector of T2 to the base of transistor T3, and a conductor 67 connects the emitter of T3 to reference 57.

The collector of T3 is likewise connected by conductor 70 to the base of transistor T4. A positive voltage reference 74 is connected by conductor 73 and resistor 72 to the base of T4 and reference 74 is likewise connected by conductor 75 to the collector of T4. The emitter of T4 is connected via conductor 77 to the collector of T5 and via conductor 79 to the negative input of voltage comparator 93.

The base of transistor T5 is connected to a current sink reference source 76 and the emitter of T5 is connected by a resistor 78 to reference 57. A conductor 83 connects the base of T5 with the base of transistor T7.

Reference 74 is connected by conductor 81 to the collector of the transistor T6 and by a resistor 80 to the base of T6. The emitter of T6 is connected by resistors R1 and R2 to the collector of T7. The emitter of T7 is connected by resistor 82 to reference 57. The common juncture of R1 and R2 is connected by conductor 86 to the positive input of comparator 93. The collector of T7 is connected by conductor 87 to the positive input of comparator 94. The emitter of T4 is also connected by conductor 79 and conductor 88 to the negative input of comparator 94. The negative input of comparator 94 is also connected by a timing capacitor 89 to reference 57.

The components illustrated in FIG. 3 perform the following functions. The latch 51 records positive transitions of data in and indicates that an output pulse is in process. Transistors T1, T2 and T3 form a differential to single-ended converter to produce a signal for switching T4.

Transistor T4 recharges the timing capacitor when in the on state. Transistor T5 produces a constant current that discharges the timing capacitor at a uniform rate when transistor T4 is switched off.

Transistors T6 and T7 produce a voltage reference that matches the timing capacitor voltage in the fully charged state. Resistors R1 and R2 produce voltage references for producing pulse Q2 and the reset signal. R1 and R2 have values such that the voltage of R1 is equal to half of the voltage from the emitter of T6 to the R1. Referring to FIGS. 3 and 4, when a signal data impulse produces a rising edge, the latch output changes to the set state (Q1=1).

This causes T1, T2 and T3 to turn T4 off. With T4 off, the timing capacitor voltage $V_c$ begins to discharge through the constant current sink produced by T5. As $V_c$ drops below $V_{r2}$, voltage comparator 93 switches to the 1 state. As $V_c$ drops further to a value below that of $V_{r1}$, voltage comparator 94 switches to the 1 state causing the reset signal to equal 1. The resulting reset signal applied to latch 51 causes the latch to return to the reset state (Q1=0). With the reset latch reset, T4 again is in the on state causing the timing capacitor voltage to rise exponentially to equal the emitter voltage of T6. Because $V_{r2}$ is halfway between the emitter voltage of T4 and $V_{r1}$, output Q2 changes from 0 to a 1 state halfway through the Q1 pulse.

This is the essential element of circuit operation that enables the system to function in the manner described. Referring now to FIGS. 5 and 6, the remaining operation of the system will be understood by explanation of the RZ data to NRZ data converter illustrated in FIG. 5.

In FIG. 5, elements corresponding to similar elements in FIG. 1 are indicated by " numerals. Thus, the Q2 output of dual-output monostable multivibrator 12 of FIG. 1 is indicated by the numeral 26″ in FIG. 5. Likewise, clock output 23 of the voltage-controlled oscillator 20 in FIG. 1 is illustrated by 23″ in FIG. 5. FIG. 5 otherwise illustrates a flip-flop 101, a flip-flop 102 and a flip-flop 103. These flip-flops are standard data flip-flops having a D or data input and a clock input. Flip-flop 101 has a Q and a $\overline{Q}$ output and flip-flop 102, 103 are illustrated with the Q output only interconnected in the circuit.

More specifically, the Q2 signal is connected by conductor 26″ to the clock input of flip-flop 101. The $\overline{Q}$ output of flip-flop 101 is connected by conductor 106 to the D input of flip-flop 101. The Q output of flip-flop 101 is connected by conductor 107 to the D input of flip-flop 102. The clock signal is connected via conductor 23″ through an inverter gate 108 and conductors 110, 111 to the clock input of flip-flop 102. The clock signal is also connected via conductor 110, 112 to the clock input of flip-flop 103. The Q output of flip-flop 102 is connected by conductor 114 to the D input of flip-flop 103 and by conductors 114, 116 to an input of an exclusive OR circuit 104. The Q output of flip-flop 103 is connected by conductor 117 to the other input of exclusive OR circuit 104. The output of the exclusive OR circuit is connected by conductor 118 to NRZ data terminal 120.

Referring to FIGS. 5 and 6, the operation of the RZ data-to-NRZ data converter is described as follows:

The circuit 100 converts the input RZ data (Q2) to NRZ data in two steps. The first step, performed by flip-flop 101, converts the RZ data input to NRZI data. The second step, accomplished by the remaining logic circuits, transforms the NRZI data from the output of flip-flop 101 into NRZ data. In the following discussion the RZ-to-NRZI conversion is first explained followed by a description of the NRZI-to-NRZ data converter.

A positive transition on signal Q2 causes the data present at the data input of data flip-flop 101 to be transferred to the output QF1 on conductor 107. At the same time, the inverting output of flip-flop 101 (not QF1) will also change state to represent the inverse of the data present at the data input. Because the inverting output of FFI (not QF1) is connected to the data input of flip-flop 101, immediately after the positive transition of input Q2, the data at the input of flip-flop 101 will change to the inverse of the previous state of the data input. The result is that with each positive transition of input Q2, the output QF1 of flip-flop 101 will change state to the inverse of its previous state. This is commonly thought of as a digital divide-by-two circuit. Because input Q2 represents RZ data, the effect of flip-flop 101 and its connections is to convert the RZ data input into NRZI data at the output of flip-flop 101.

NRZI data from flip-flop 101 is coupled to the data input of flip-flop 102. The clock input of flip-flop 102 is the inverted signal of CLOCK, generated by the voltage-controlled oscillator, shown in FIG. 1. This CLOCK signal is nominally in phase, such that a rising edge of CLOCK coincides with a rising edge on Q2. Consequently, a rising edge on Q2 corresponds to a falling edge at the clock input of flip-flop 102. The inversion of the CLOCK signal is accomplished by logic inverter 108. Because flip-flop 102 is a positive-edge triggered data flip-flop (as are flip-flops 101 and 103), the NRZI data at the input of flip-flop 102 is transferred to its output at the rising edge of its clock input or at the falling edge of the CLOCK input. If the NRZI data had changed since the last falling edge of CLOCK, the output of flip-flop 102 will change state as well. The overall effect of flip-flop 102 is to produce a "clocking window" from the previous falling edge of CLOCK to the present falling edge of CLOCK. The flip-flop 103 merely records the previous state of flip-flop 102 again at the falling edge of CLOCK. If no transition has occurred on the NRZI data input since the previous falling edge of CLOCK, the outputs of both flip-flops 102 and 103 will be the same. This means that the inputs to exclusive OR gate 104 will be equal (both "1" or "0"). The output of gate 104 will, therefore, be "0" representing an NRZ data value of "0". Conversely, if there had been a transition on NRZI data since the last falling edge of CLOCK, the outputs of flip-flops 102 and 103 will be opposite of each other. This condition produces a "1" at the NRZ data output.

While the invention has been particularly shown and described with reference to a preferred embodiment thereof, it will be understood by those skilled in the art that various changes in form and details may be made therein without departing from the spirit and scope of the invention.

Alternative implementations may include the use of a tapped delay line to produce the required outputs of the dual-output monostable multivibrator.

What is claimed is:

1. A data detector for extracting clock information from an encoded run length limited data signal, including circuit means for receiving a return-to-zero data signal and producing a first fixed width pulse in response to each positive transition of the data signal;
   variable frequency oscillator means for producing a clock signal;
   charge pump means for comparing the phase of the clock signal with the phase of said first fixed width pulse and producing an oscillator control signal to vary the frequency of the oscillator means in response to positive and negative errors therein;
   said circuit means also providing a second fixed width pulse of shorter duration having a positive transition that occurs at the same time phase as the middle of the pulse interval of the first fixed width pulse with the second fixed width pulse comprising a data signal synchronized in phase with the clock signal when the loop is locked.

2. The circuit of claim 1 wherein said circuit means comprises a dual-output monostable multivibrator having a Q1 output that serves as the first fixed width pulse and a Q2 output that provides the second fixed width pulse set forth therein.

3. The circuit of claim 2 wherein the first fixed width pulse is provided as an output to each of a pair of logic gates to provide charge-up and charge-down signals, respectively to said charge pump means.

4. The circuit of claim 3 further including:
   a feedback circuit from the variable frequency oscillator to one of said logic gates, to supply a clock signal thereto.

5. The data detector of claim 1 further including:
   clocking circuit means for forming a clocking window for the second fixed width pulse that enables conversion of the return-to-zero data signal to an NRZI signal; and
   convertor circuit means for converting the NRZI data signal to an NRZ data signal.

* * * * *